United States Patent
Kurahori et al.

(10) Patent No.: US 11,488,885 B2
(45) Date of Patent: Nov. 1, 2022

(54) HEAT SINK

(71) Applicant: Mitsubishi Electric Corporation, Tokyo (JP)

(72) Inventors: Takahiro Kurahori, Tokyo (JP); Tatsuki Matsunaga, Tokyo (JP); Takahiro Harada, Tokyo (JP); Yuki Okada, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/637,076

(22) PCT Filed: Dec. 2, 2019

(86) PCT No.: PCT/JP2019/046977
§ 371 (c)(1),
(2) Date: Feb. 22, 2022

(87) PCT Pub. No.: WO2021/111493
PCT Pub. Date: Jun. 10, 2021

(65) Prior Publication Data
US 2022/0270947 A1    Aug. 25, 2022

(51) Int. Cl.
*H01L 23/367* (2006.01)
*H01L 23/373* (2006.01)
*H05K 7/20* (2006.01)

(52) U.S. Cl.
CPC ........ *H01L 23/367* (2013.01); *H01L 23/3737* (2013.01); *H05K 7/209* (2013.01)

(58) Field of Classification Search
CPC ....... H01L 23/34; H01L 23/36; H01L 23/367; H01L 23/3737; H05K 7/00; H05K 7/20; H05K 7/209

(Continued)

(56) References Cited

U.S. PATENT DOCUMENTS 9,820,413 B2 * 11/2017 Ikezawa .................. H02M 3/28
2017/0064867 A1 * 3/2017 Skaar ........................ F28F 7/02
(Continued)

FOREIGN PATENT DOCUMENTS

| CN | 111065878 A * | 4/2020 | ............ F21V 23/001 |
| JP | 2004-14991 A | 1/2004 | |

(Continued)

OTHER PUBLICATIONS

Machine Translation JP 2006294918A (Year: 2006).*
(Continued)

*Primary Examiner* — Len Tran
*Assistant Examiner* — Gustavo A Hincapie Serna
(74) *Attorney, Agent, or Firm* — Xsensus LLP

(57) ABSTRACT

A heat sink includes a first surface including an attachment area to which a semiconductor module is attached and is installed such that a first side of the first surface extends in a vertical direction. Thermal grease containing oil is applied to the attachment area. A first groove extending in a horizontal direction is formed below the attachment area in the first surface. An inner wall of the first groove includes a groove top surface and a groove bottom surface spaced below the groove top surface. The length of the first groove in the horizontal direction is shorter than the length of the first surface in the horizontal direction. A wall includes a first wall extending in the horizontal direction and second walls respectively connected to both end portions of the first wall in the horizontal direction and inclined upward as the second walls extend away from the first wall.

6 Claims, 14 Drawing Sheets

(58) Field of Classification Search
USPC .................................................. 361/185, 186
See application file for complete search history.

(56) References Cited

U.S. PATENT DOCUMENTS

| | | | |
|---|---|---|---|
| 2018/0054914 A1* | 2/2018 | James | H05K 1/0203 |
| 2018/0197833 A1* | 7/2018 | Sakakibara | H01L 24/32 |
| 2020/0043824 A1* | 2/2020 | Tada | H01L 21/56 |
| 2020/0091033 A1* | 3/2020 | Kobayashi | H05K 7/2039 |
| 2021/0066235 A1* | 3/2021 | Oomori | H01L 24/73 |
| 2021/0226007 A1* | 7/2021 | Nishita | H01L 28/92 |

FOREIGN PATENT DOCUMENTS

| | | | | |
|---|---|---|---|---|
| JP | 2005-5519 | A | | 1/2005 |
| JP | 2005005519 | A * | | 1/2005 |
| JP | 2006-294918 | A | | 10/2006 |
| JP | 2006294918 | A * | | 10/2006 |
| JP | 2008004745 | A * | | 1/2008 |
| JP | 2009-211815 | A | | 9/2009 |
| JP | 2012-4358 | A | | 1/2012 |
| JP | 2013-74010 | A | | 4/2013 |
| JP | 2017-34167 | A | | 2/2017 |
| JP | 2017034167 | A * | | 2/2017 |
| JP | 2017-130538 | A | | 7/2017 |
| JP | 2017130538 | A * | | 7/2017 |
| MY | 158347 | A * | 9/2016 | ......... C23C 18/1607 |

OTHER PUBLICATIONS

International Search Report and Written Opinion dated Feb. 10, 2020, received for PCT Application PCT/JP2019/046977, Filed on Dec. 2, 2019, 10 pages including English Translation.
Notice of Reasons for Refusal dated Sep. 15, 2020, received for JP Application 2020-526335, 4 pages including English Translation.
Decision to Grant dated Nov. 24, 2020, received for JP Application 2020-526335, 5 pages including English Translation.

* cited by examiner

HEAT SINK

CROSS-REFERENCE TO RELATED APPLICATION

The present application is based on PCT filing PCT/JP2019/046977, filed Dec. 2, 2019, the entire contents of which are incorporated herein by reference.

FIELD

The present invention relates to a heat sink that dissipates heat generated by a heating element.

BACKGROUND

There have been known heat sinks that dissipate heat generated by heating elements such as semiconductor modules. A semiconductor module and a heat sink are installed, for example, in power conversion apparatuses. In general, a heat sink includes a rectangular base plate to the front surface of which a semiconductor module is attached and a plurality of fins attached to the back surface of the base plate and disposed parallel to each other. The front surface of the base plate includes an attachment area to which the semiconductor module is attached. In general, thermal grease is applied to the attachment area in the heat sink to improve the thermal conductivity between the semiconductor module and the heat sink. Moreover, thermal grease contains oil to improve the ease of applying the thermal grease to the attachment area in the heat sink.

In some cases, the oil separates from the thermal grease and escapes, or leaks, from between the attachment area in the heat sink and the semiconductor module because of the aging or change in temperature of the thermal grease. When the heat sink is disposed such that the front surface of the base plate extends in the vertical direction, the oil escaped may flow down the front surface of the base plate and may flow out of the apparatus that includes the semiconductor module. In such a case, there arises a problem in that the oil fouls devices installed outside the apparatus that includes the semiconductor module, the floor at the installation site of the apparatus that includes the semiconductor module, and the like.

As a technique to solve such a problem, Patent Literature 1 discloses a heat sink provided with a groove below the attachment area on the front surface of the base plate. The heat sink disclosed in Patent Literature 1 can retain oil separated from the thermal grease in the groove and thus can inhibit the escape of the oil from the apparatus that includes the semiconductor module. The inner wall of the groove includes a groove top surface and a groove bottom surface spaced below the groove top surface.

CITATION LIST

Patent Literature

Patent Literature 1: Japanese Patent Application Laid-open No. 2006-294918

SUMMARY

Technical Problem

In the heat sink disclosed in Patent Literature 1, the oil is retained only by the groove; therefore, the amount of oil that can be retained depends on the volume of the groove. There is a demand for the development of the structure that enables more oil to be retained in a heat sink to which thermal grease containing oil is applied.

Moreover, in the heat sink disclosed in Patent Literature 1, the groove is formed throughout the length in the horizontal direction of the front surface of the base plate and thus reaches the side surfaces of the base plate. Accordingly, the oil may flow to the side surfaces of the base plate along the groove, flow along the side surfaces of the base plate, and then escape from the apparatus that includes the semiconductor module.

The present invention has been achieved in view of the above and an object of the present invention is to provide a heat sink that can increase the amount of oil to be retained compared to the conventional techniques and can inhibit the escape of oil from an apparatus that includes a semiconductor module.

Solution to Problem

In order to solve the above problems and achieve the object, a heat sink according to the present invention is a heat sink that includes a first surface including an attachment area to which a heating element is attached and that is installed such that a first side of the first surface extends in a vertical direction, and a thermal grease containing oil is applied to the attachment area. A first groove extending in a horizontal direction is formed below the attachment area in the first surface. An inner wall of the first groove includes a groove top surface and a groove bottom surface spaced below the groove top surface. A length of the first groove in the horizontal direction is shorter than a length of the first surface in the horizontal direction. A wall is formed on the first surface and projects from the first surface. When the heat sink is installed such that the first side of the first surface extends in the vertical direction, the first groove and the wall are disposed such that a position of the wall is lower than a position of the first groove in the vertical direction. The wall includes a first wall extending in the horizontal direction and second walls that are respectively connected to both end portions of the first wall in the horizontal direction and are inclined upward as the second walls extend away from the first wall.

Advantageous Effects of Invention

According to the present invention, an effect is obtained where it is possible to increase the amount of oil to be retained compared to the conventional techniques and inhibit the escape of oil from an apparatus that includes a semiconductor module.

DESCRIPTION OF EMBODIMENTS

A heat sink according to embodiments of the present invention will be described below in detail with reference to the drawings. The embodiments are not intended to limit this invention.

First Embodiment

Figure 1:
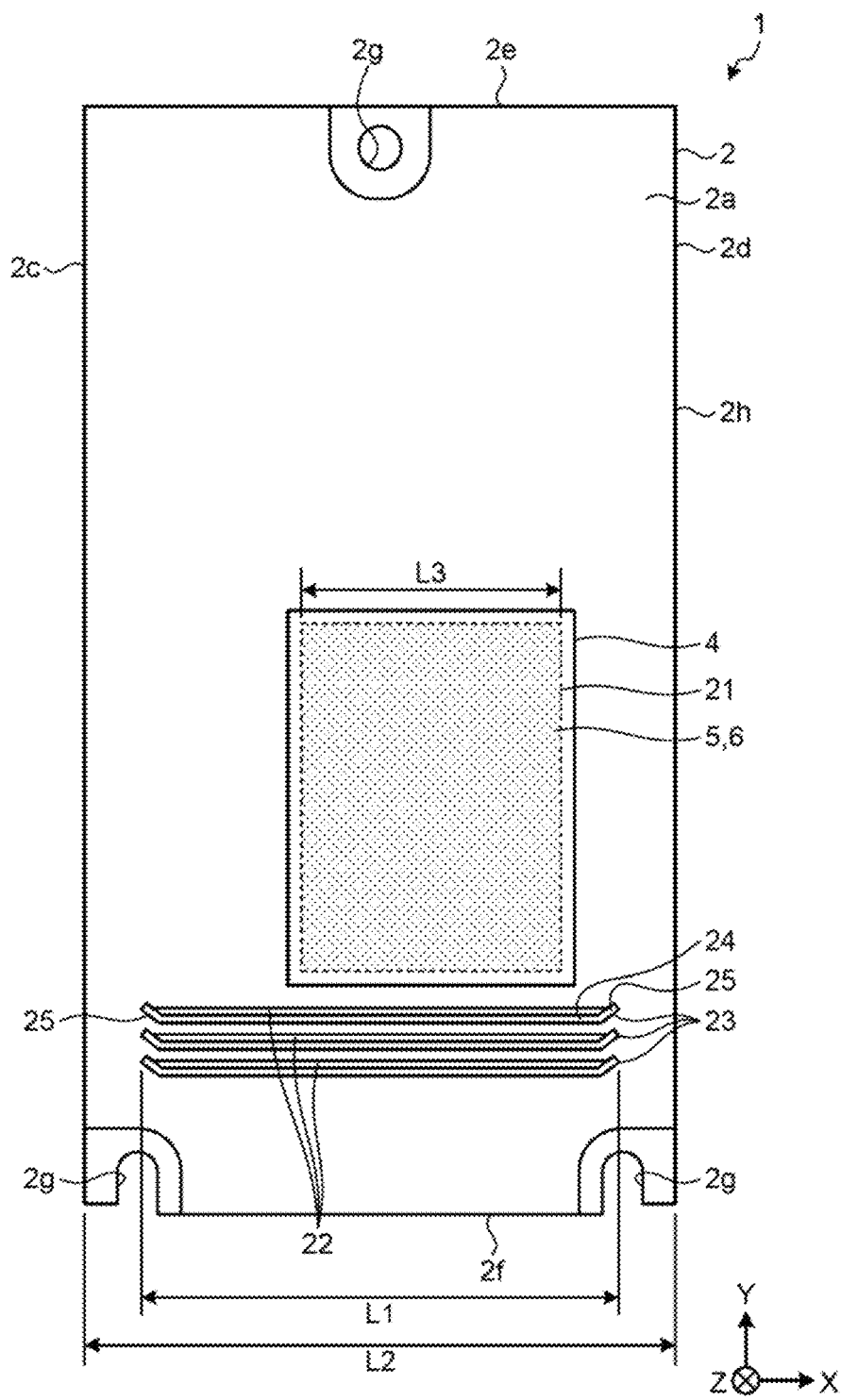
FIG. 1 is a front view of a heat sink according to a first embodiment of the present invention.

FIG. 1 is a front view of a heat sink 1 according to a first embodiment of the present invention. Hereinafter, the width direction of the heat sink 1 is defined as an X-axis direction, the height direction of the heat sink 1 is defined as a Y-axis direction, and the depth direction of the heat sink 1 is defined as a Z-axis direction. The X-axis direction, the Y-axis direction, and the Z-axis direction are orthogonal to each other. The X-axis direction and the Z-axis direction coincide with the horizontal direction. The Y-axis direction coincides with the vertical direction. In the following description, the X-axis direction is in some cases referred to as the horizontal direction and the Y-axis direction is in some cases referred to as the vertical direction. A semiconductor module 4 that is a heating element is, for example, a module in which a semiconductor element that converts power is covered with a molding resin or the like. When the semiconductor module 4 is driven, the semiconductor module 4 generates heat. The heating element is not limited to the semiconductor module 4 and may be, for example, a step-up transformer or a reactor.

Figure 2:
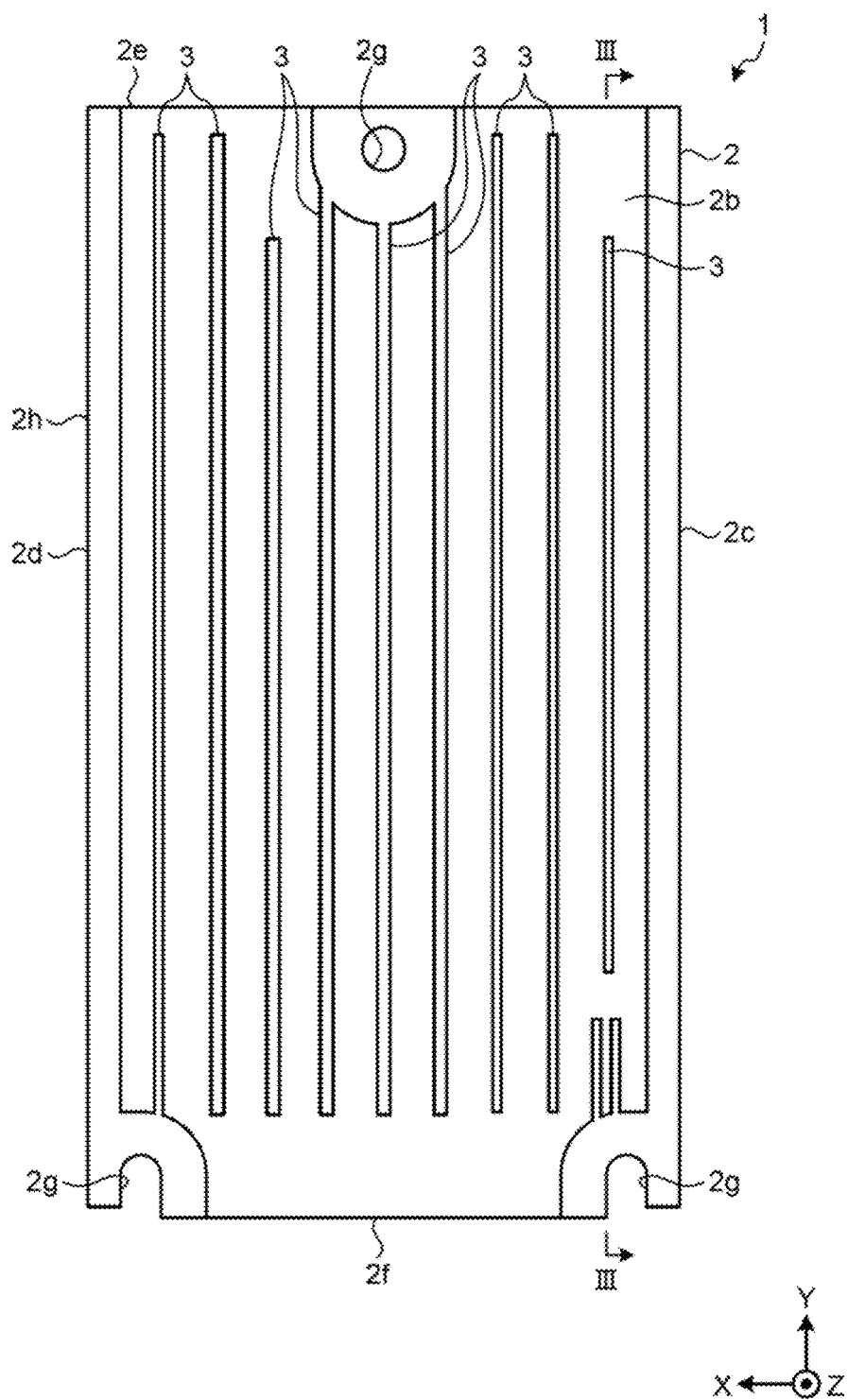
FIG. 2 is a back view of the heat sink according to the first embodiment of the present invention.
Figure 3:
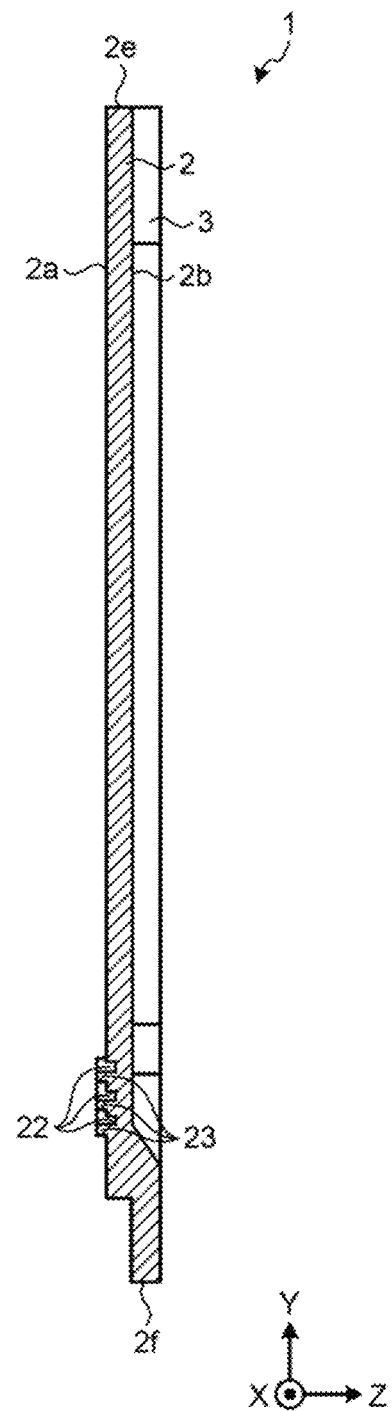
FIG. 3 is a cross-sectional view of the heat sink taken along line III-III in FIG. 2.

The heat sink 1 is a member that dissipates heat generated by the semiconductor module 4. The heat sink 1 is made of a metal material having a high thermal conductivity. The metal material having a high thermal conductivity is, for example, copper and aluminum. FIG. 2 is a back view of the heat sink 1 according to the first embodiment of the present invention. FIG. 3 is a cross-sectional view of the heat sink 1 taken along line III-III in FIG. 2. The heat sink 1 includes a base plate 2 and a plurality of fins 3.

The base plate 2 illustrated in FIG. 1 and FIG. 2 is a rectangular plate-like member. The base plate 2 includes a first surface 2a, a second surface 2b, a third surface 2c, a fourth surface 2d, a top surface 2e, and a bottom surface 2f. Each of the surfaces 2a to 2f has a rectangular shape in the present embodiment.

As illustrated in FIG. 1, the first surface 2a is a surface that includes an attachment area 21 to which the semiconductor module 4 is attached. In FIG. 1, the attachment area 21 to which the semiconductor module 4 has been attached cannot be seen and is thus illustrated by dashed lines. In FIG. 1, thermal grease 5 applied to the attachment area 21 is represented by a dot pattern. The first surface 2a has a first side 2h. The heat sink 1 is installed such that the first side 2h of the first surface 2a extends in the vertical direction. The semiconductor module 4 adheres to the attachment area 21. Although the shape of the attachment area 21 is not specifically limited, the attachment area 21 has a rectangular shape that is longer in the vertical direction than in the horizontal direction in the present embodiment. The thermal grease 5 is applied to the attachment area 21. The thermal grease 5 contains oil 6.

First grooves 22 extending linearly in the horizontal direction are formed below the attachment area 21 in the first surface 2a. The first grooves 22 serve to retain the oil 6 that has been separated from the thermal grease 5 and has flown downwardly. The length L1 of the first grooves 22 in the horizontal direction is shorter than the length L2 of the first surface 2a in the horizontal direction. In other words, the first grooves 22 do not reach the third surface 2c and the fourth surface 2d. The length L1 of the first grooves 22 in the horizontal direction is longer than the length L3 of the attachment area 21 in the horizontal direction.

As illustrated in FIG. 2, the second surface 2b is a surface opposite the first surface 2a and is parallel to the first surface 2a. The fins 3 are provided on the second surface 2b. The fins 3 extend in the vertical direction and are plate shaped. The fins 3 are spaced from and parallel to each other in the horizontal direction.

The third surface 2c is a surface that connects the end portions on one side in the horizontal direction of the first surface 2a and the second surface 2b. The fourth surface 2d is a surface that connects the end portions on the other side in the horizontal direction of the first surface 2a and the second surface 2b, and is a surface parallel to the third surface 2c. The top surface 2e is a surface that connects the upper end portions of the first surface 2a to the fourth surface 2d. The bottom surface 2f is a surface that connects the lower end portions of the first surface 2a to the fourth surface 2d. The bottom surface 2f is a surface that is spaced below the top surface 2e and is parallel to the top surface 2e. Attachment holes 2g for attaching the heat sink 1 to the apparatus (not illustrated) that includes the semiconductor module 4 are formed in the upper and lower ends of the base plate 2. The attachment holes 2g extend from the first surface 2a to the second surface 2b. The apparatus that includes the semiconductor module 4 is, for example, a power conversion apparatus. Hereinafter, a description will be given of an example where the apparatus that includes the semiconductor module 4 is a power conversion apparatus; however, this is not intended to limit the apparatus in which the heat sink 1 is installed.

Figure 4:
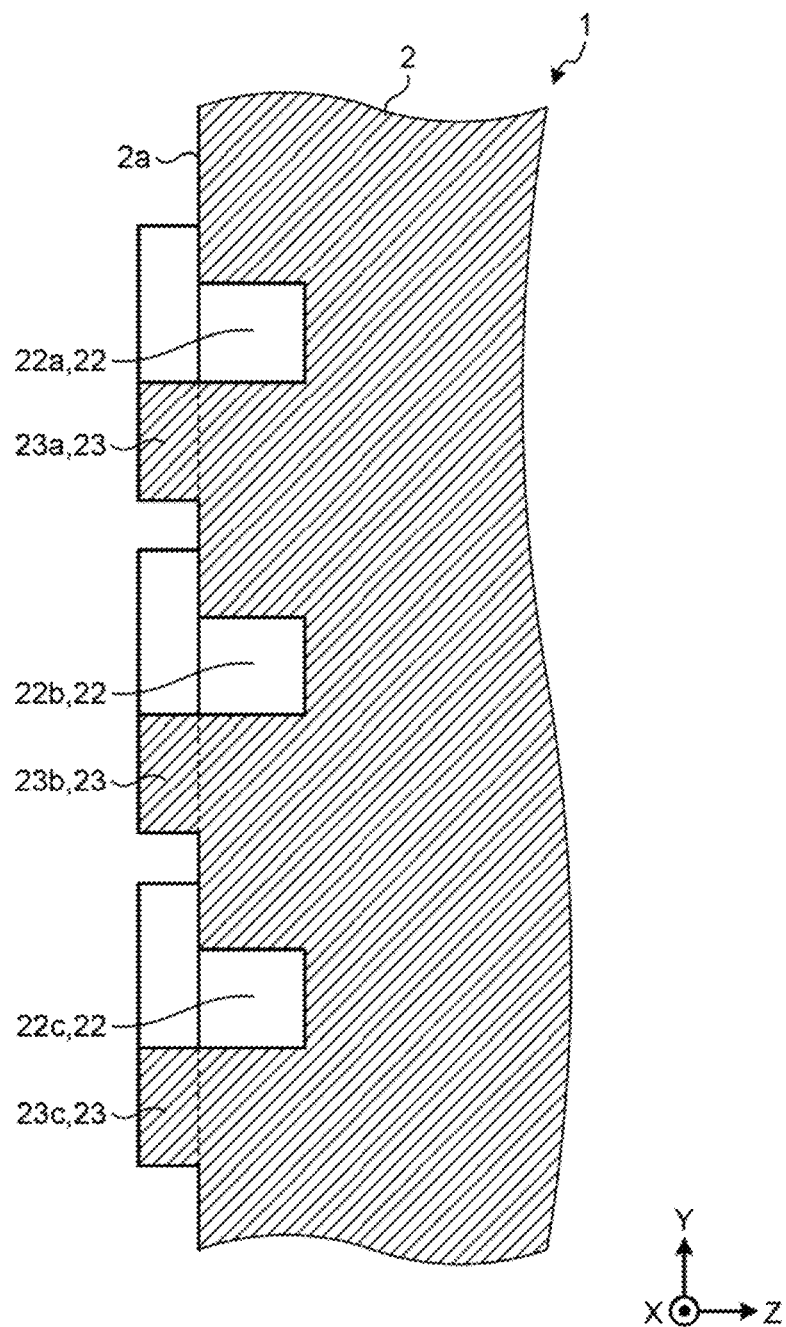
FIG. 4 is an enlarged cross-sectional view of first grooves and walls illustrated in FIG. 3.

FIG. 4 is an enlarged cross-sectional view of the first grooves 22 and walls 23 illustrated in FIG. 3. Although the number of the first grooves 22 is not specifically limited, three first grooves 22 are provided spaced apart from each other in the vertical direction in the present embodiment. The walls 23 are formed on the first surface 2a and project from the first surface 2a. The walls 23 project perpendicularly to the first surface 2a. One wall 23 is formed in the lower portion of the opening edge of each first groove 22. The walls 23 equivalent in number to the first grooves 22 are provided. Specifically, three walls 23 are provided spaced apart from each other in the vertical direction. Hereinafter, when a distinction is made between the three first grooves 22, they are referred to as a first groove 22a, a first groove 22b, and a first groove 22c from top to bottom. When a distinction is made between the three walls 23, they are referred to as a wall 23a, a wall 23b, and a wall 23c from top to bottom. When the heat sink 1 is disposed such that the first side 2h of the first surface 2a extends in the vertical direction, the first groove 22a and the wall 23a are disposed such that the position of the wall 23a is lower than the position of the first groove 22a in the vertical direction. Moreover, when the heat sink 1 is disposed such that the first side 2h of the first surface 2a extends in the vertical direction, the first groove 22b and the wall 23b are disposed such that the position of the wall 23b is lower than the position of the first groove 22b in the vertical direction. Moreover, when the heat sink 1 is disposed such that the first side 2h of the first surface 2a extends in the vertical direction, the first groove 22c and the wall 23c are disposed such that the position of the wall 23c is lower than the position of the first groove 22c in the vertical direction.

Figure 5:
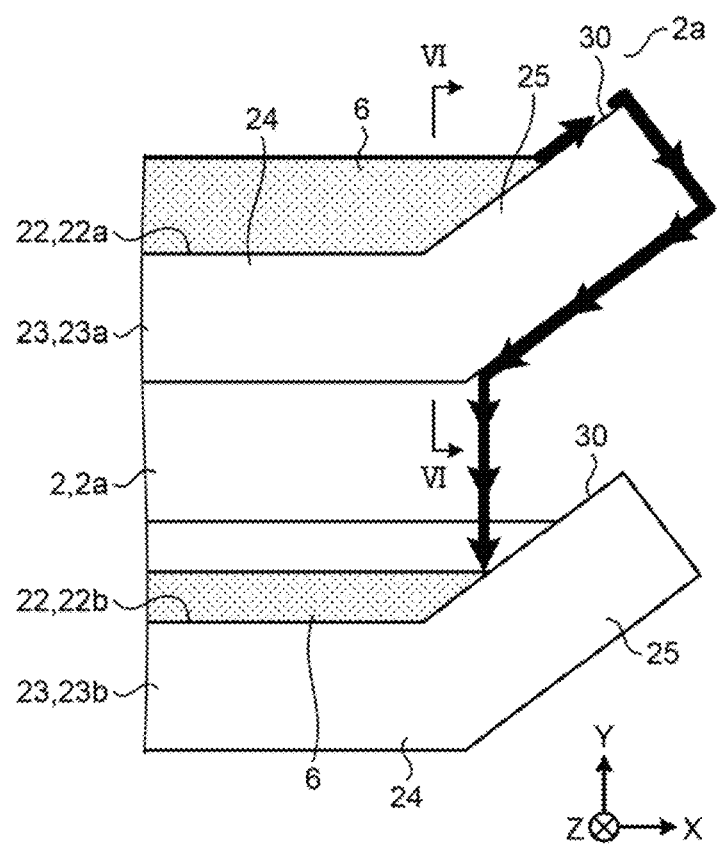
FIG. 5 is an enlarged view of the first grooves and the walls illustrated in FIG. 1.
Figure 6:
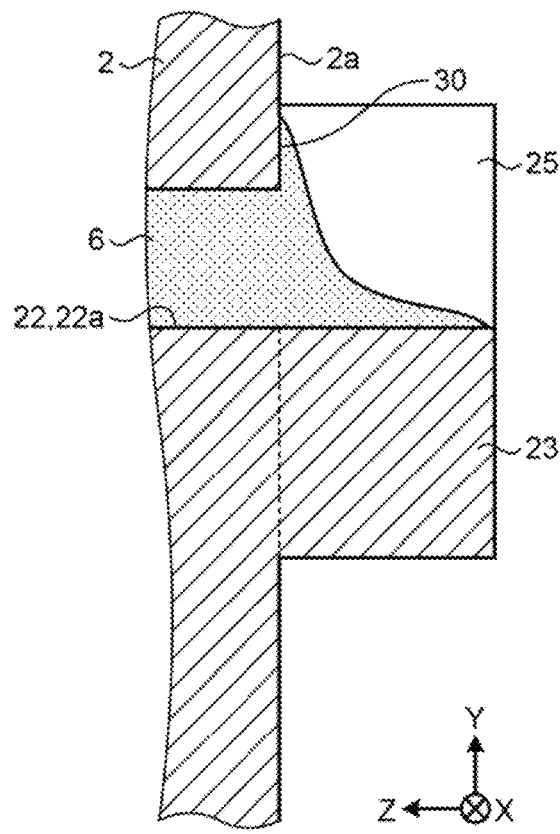
FIG. 6 is a cross-sectional view of the first groove and the wall taken along line VI-VI in FIG. 5.

FIG. 5 is an enlarged view of the first grooves 22 and the walls 23 illustrated in FIG. 1. FIG. 6 is a cross-sectional view of the first groove 22 and the wall 23 taken along line VI-VI in FIG. 5. The walls 23 each include a first wall 24 extending linearly in the horizontal direction and second walls 25 respectively connected to both end portions of the first wall 24 in the horizontal direction. FIG. 5 illustrates only the second walls 25 on one side. The first wall 24 is formed in the lower portion of the opening edge of each first groove 22. The second walls 25 are inclined upward as they extend away from the end portions of the first wall 24 in the horizontal direction. In other words, both end portions of the wall 23 in the horizontal direction are located at positions higher than the central portion of the wall 23 in the horizontal direction. The second walls 25 are formed in the lateral portions of the opening edge of each first groove 22. The second walls 25 extend up above the first groove 22. A corner portion 30 extending diagonally upward is formed between the portion of the second wall 25 located above the first groove 22 and the first surface 2a.

Figure 7:
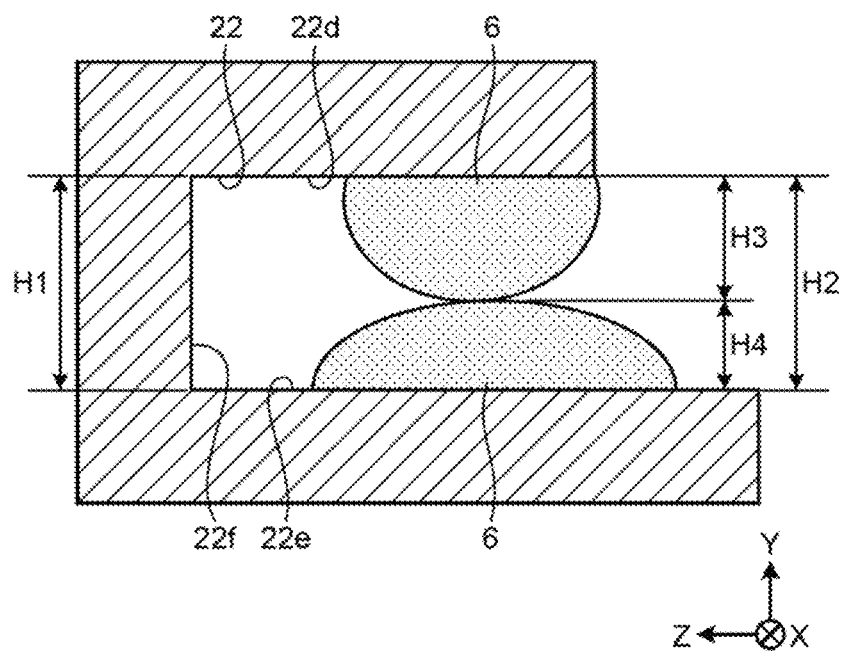
FIG. 7 is a cross-sectional view for explaining the height of the first grooves in the vertical direction.

A description will be further given of the configuration of the first grooves 22 with reference to FIG. 7. FIG. 7 is a cross-sectional view for explaining the height H1 of the first grooves 22 in the vertical direction. The first grooves 22 each have a rectangular cross-section in the present embodiment. The inner wall of each first groove 22 includes a groove top surface 22d, a groove bottom surface 22e spaced below the groove top surface 22d, and a groove side surface 22f that connects the end portions on the far side of the groove top surface 22d and the groove bottom surface 22e. When the oil 6 adheres to the groove top surface 22d, the oil 6 forms into a droplet because of the surface tension and is retained on the groove top surface 22d. On the other hand, when the oil 6 adheres to the groove bottom surface 22e, the oil 6 forms into a droplet because of the surface tension and is retained on the groove bottom surface 22e. The first height H3 represents the height of the oil 6 retained on the groove top surface 22d in the form of a droplet due to the surface tension, immediately before dropping to the groove bottom surface 22e. The second height H4 represents the maximum rise height of the oil 6 retained on the groove bottom surface 22e and formed into a droplet while maintaining the surface tension. The height H1 of the first grooves 22 in the vertical direction is set lower than or equal to the third height H2 that is the first height H3 plus the second height H4. As described above, the height H1 of the first grooves 22 in the vertical direction is determined taking into account the surface tension of the oil 6 contained in the thermal grease 5. The first height H3, the second height H4, and the third height H2 are determined by tests performed in advance, simulation, calculations, or the like.

A description will be given of an example of a method for calculating the height H1 of the first grooves 22 in the vertical direction, the first height H3, the second height H4, and the third height H2. The second height H4 is determined by the following formula (1). The symbol "r" represents the radius of a droplet of the oil 6 retained on the groove bottom surface 22e. The symbol "θ" represents the contact angle of a droplet of the oil 6 retained on the groove bottom surface 22e. The following formula (1) is satisfied under the condition that the oil 6 adheres to the groove bottom surfaces 22e made of the same material and having the same surface condition.

$$H4 = r \cdot \tan(\theta/2) \quad (1)$$

The first height H3 is higher than the second height H4 because of gravity. In other words, the relationship H3>H4 is satisfied. Thus, twice the second height H4 is lower than the third height H2 that is the first height H3 plus the second height. H4. In other words, the relationship 2·H4<H2 is satisfied. As described above, since it is satisfactory if the height H1 of the first grooves 22 in the vertical direction is set lower than or equal to the third height H2, the height H1 of the first grooves 22 in the vertical direction may be set equal to twice the second height H4. Thus, the height H1 of the first grooves 22 in the vertical direction may be determined also by the following formula (2).

$$H1 = 2 \cdot H4 \quad (2)$$

Next, a description will be given of an effect of the heat sink 1 according to the present embodiment.

As illustrated in FIG. 4, in the present embodiment, the walls 23 are formed on the first surface 2a and project from the first surface 2a. One wall 23 is formed in the lower portion of the opening edge of each first groove 22. As illustrated in FIG. 5, the walls 23 each include the first wall 24 extending in the horizontal direction and the second walls 25 respectively connected to both end portions of the first wall 24 in the horizontal direction. The second walls 25 are inclined upward as they extend away from the first wall 24. In the present embodiment, the oil 6 can be retained not only by the first grooves 22 but also by the first walls 24 and the second walls 25; therefore, the amount of the oil 6 that can be retained on the first surface 2a can be increased compared with the case where only the first grooves 22 are provided on the first surface 2a. Moreover, as illustrated in FIG. 5, when the amount of the oil 6 retained in the upper first groove 22a exceeds the acceptable amount of the oil 6 of the first groove 22a, the oil 6 flows along the second wall 25 and is directed to the surface of the lower second wall 25 connected to the first groove 22b. Thus, the oil 6 is definitely directed to the first groove 22b; therefore, the oil 6 can be prevented or suppressed from flowing along the first surface 2a of the heat sink 1 and escaping from the power conversion apparatus. Moreover, the corner portion 30 formed between the second wall 25 and the first surface 2a serves to reduce the surface area of the oil 6 by the surface tension at the corner portion 30; therefore, the oil 6 is easily drawn up along the corner portion 30. In the present embodiment, the oil 6 flows from the first groove 22 and the wall 23 located on the upper side to the first groove 22 and the wall 23 located on the lower side; therefore, the amount of the oil 6 that can be retained on the first surface 2a can be easily increased by increasing the number of the first grooves 22 and the walls 23.

As illustrated in FIG. 1, in the present embodiment, the length L1 of the first grooves 22 in the horizontal direction is shorter than the length L2 of the first surface 2a in the horizontal direction; therefore, the oil 6 can be prevented or suppressed from flowing along the first grooves 22 and flowing around to the third surface 2c and the fourth surface 2d. Therefore, the oil 6 can be prevented or suppressed from flowing along the third surface 2c and the fourth surface 2d and escaping from the power conversion apparatus.

Figure 8:
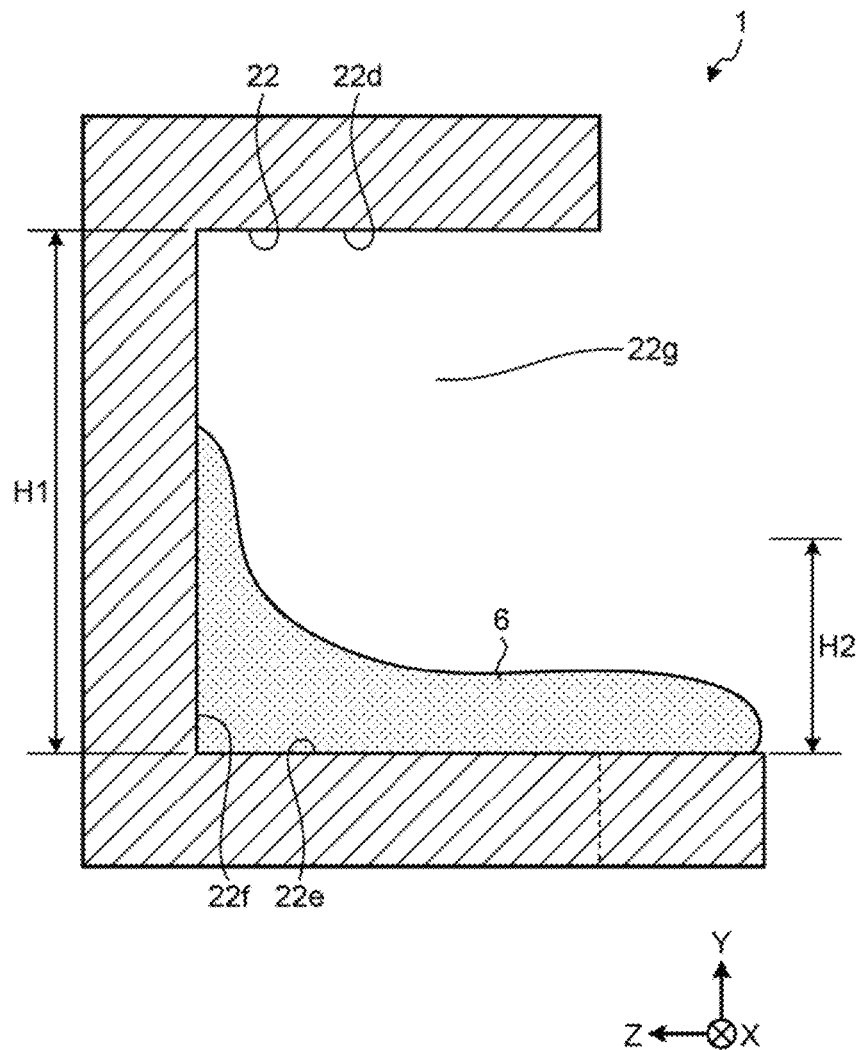
FIG. 8 is a cross-sectional view of the heat sink according to a comparison example in which oil is retained in the first groove.
Figure 9:
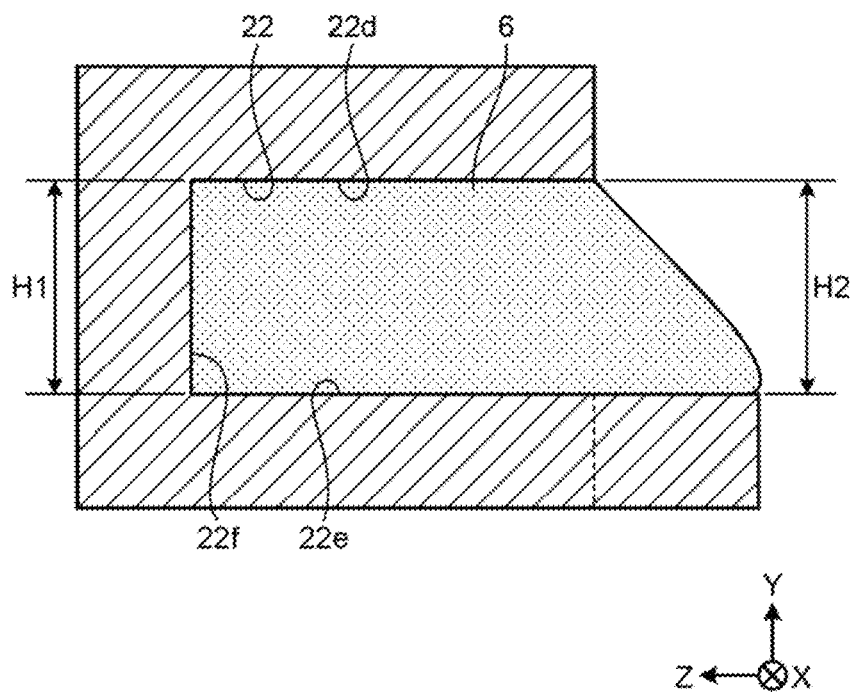
FIG. 9 is a cross-sectional view of the heat sink according to the first embodiment of the present invention in which the oil is retained in the first groove.

FIG. 8 is a cross-sectional view illustrating a state where the oil 6 is retained in the first groove 22 in the heat sink 1 according to a comparison example. As illustrated in FIG. 8, in the heat sink 1 according to the comparison example, the height H1 of the first groove 22 in the vertical direction is higher than the third height H2 described above. When the height H1 of the first groove 22 in the vertical direction is higher than the third height H2 described above as in the comparison example, the oil 6 does not fill the entire first groove 22 and thus a gap 22g is formed within the first groove 22. In the comparison example, the amount of the oil 6 retained in the first groove 22 is smaller than the volume of the first groove 22; therefore, the oil 6 cannot be retained in the first groove 22 efficiently. FIG. 9 is a cross-sectional view illustrating a state where the oil 6 is retained in the first groove 22 in the heat sink 1 according to the first embodiment. In the present embodiment, the height H1 of the first groove 22 in the vertical direction is set lower than or equal to the third height H2 described above; therefore, the oil 6 fills the entire first groove 22 as illustrated in FIG. 9 and thus it is possible to utilize the entire first groove 22 without wasting space. This means that the oil 6 can be retained in the first groove 22 efficiently. Therefore, the oil 6 can be prevented or suppressed from flowing along the first surface 2a of the heat sink 1 and escaping from the power conversion apparatus. Even when the height H1 of the first groove 22 in the vertical direction is set equal to twice the second height H4 illustrated in FIG. 7, the oil 6 fills the entire first groove 22 as illustrated in FIG. 9; therefore, the entire first groove 22 can be utilized without wasting space.

Second Embodiment

Figure 10:
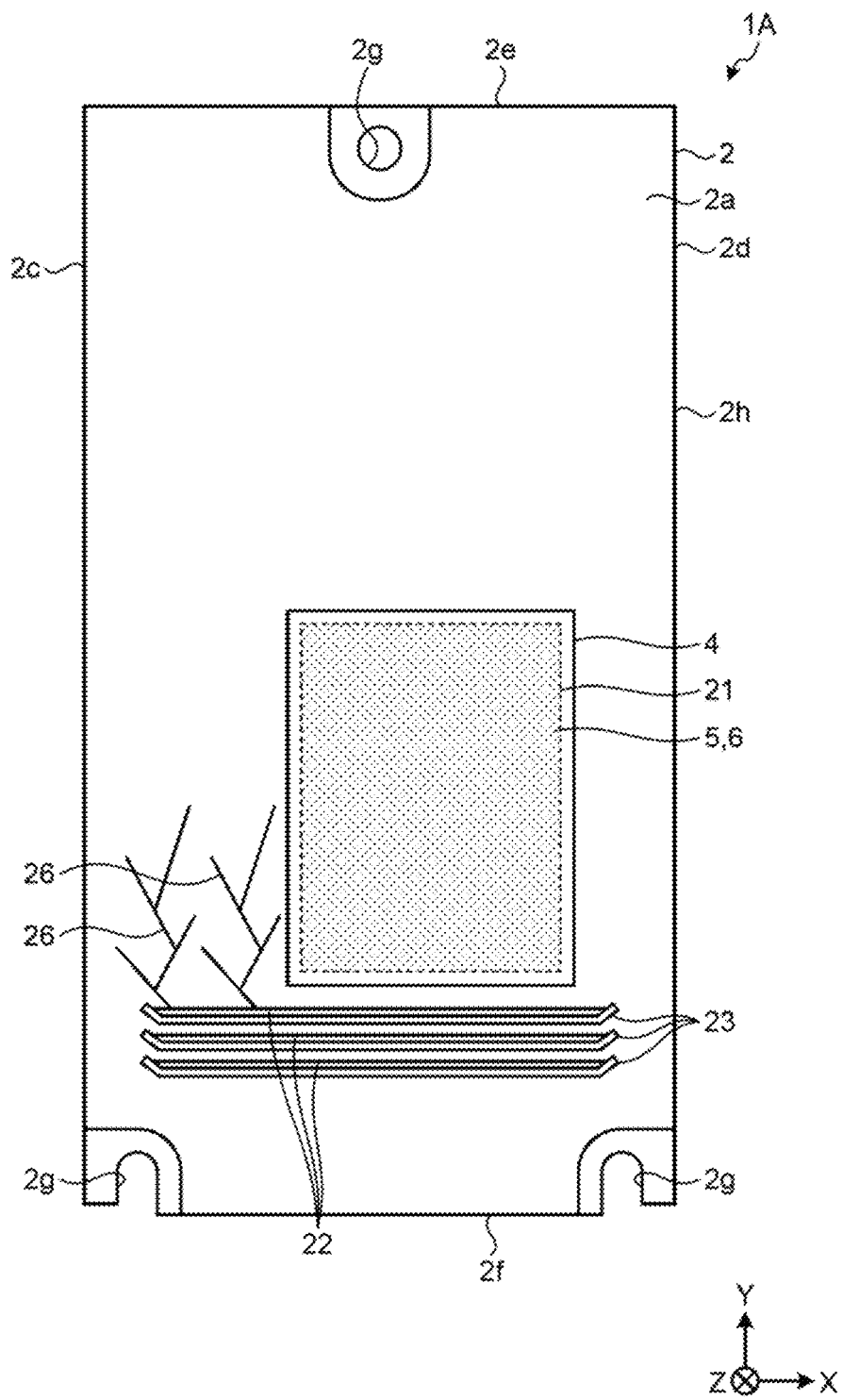
FIG. 10 is a front view of a heat sink according to a second embodiment of the present invention.

FIG. 10 is a front view of a heat sink 1A according to a second embodiment of the present invention. The present embodiment is different from the first embodiment in that second grooves 26 are further formed on the first surface 2a. In the second embodiment, the parts that are the same as those in the first embodiment described above are designated by the same reference characters and descriptions thereof will be omitted.

The second grooves 26 are formed on the first surface 2a at positions different from the attachment area 21 and the first grooves 22. Although the number of the second grooves 26 is not specifically limited, two second grooves 26 are formed in the present embodiment. Each of the second grooves 26 branches into a plurality of grooves as it extends upwardly from the first groove 22. The second grooves 26 each include a plurality of inclined portions inclined with respect to the vertical direction. The groove width of the second grooves 26 is smaller than the groove width of the first grooves 22. The groove width of the second grooves 26 is set to the size with which capillary action works. The second grooves 26 are disposed lateral to the attachment area 21 above the first grooves 22. The second grooves 26 communicate with the uppermost first groove 22.

In the present embodiment, the groove width of the second grooves 26 is smaller than the groove width of the first grooves 22 and is set to the size with which capillary action works. Thus, the oil 6 retained by the first grooves 22 and the walls 23 can be drawn up to the second grooves 26 or the oil 6 before reaching the first grooves 22 and the walls 23 can be retained in the second grooves 26. Therefore, the amount of the oil 6 that can be retained on the first surface 2a can be increased.

Third Embodiment

Figure 11:
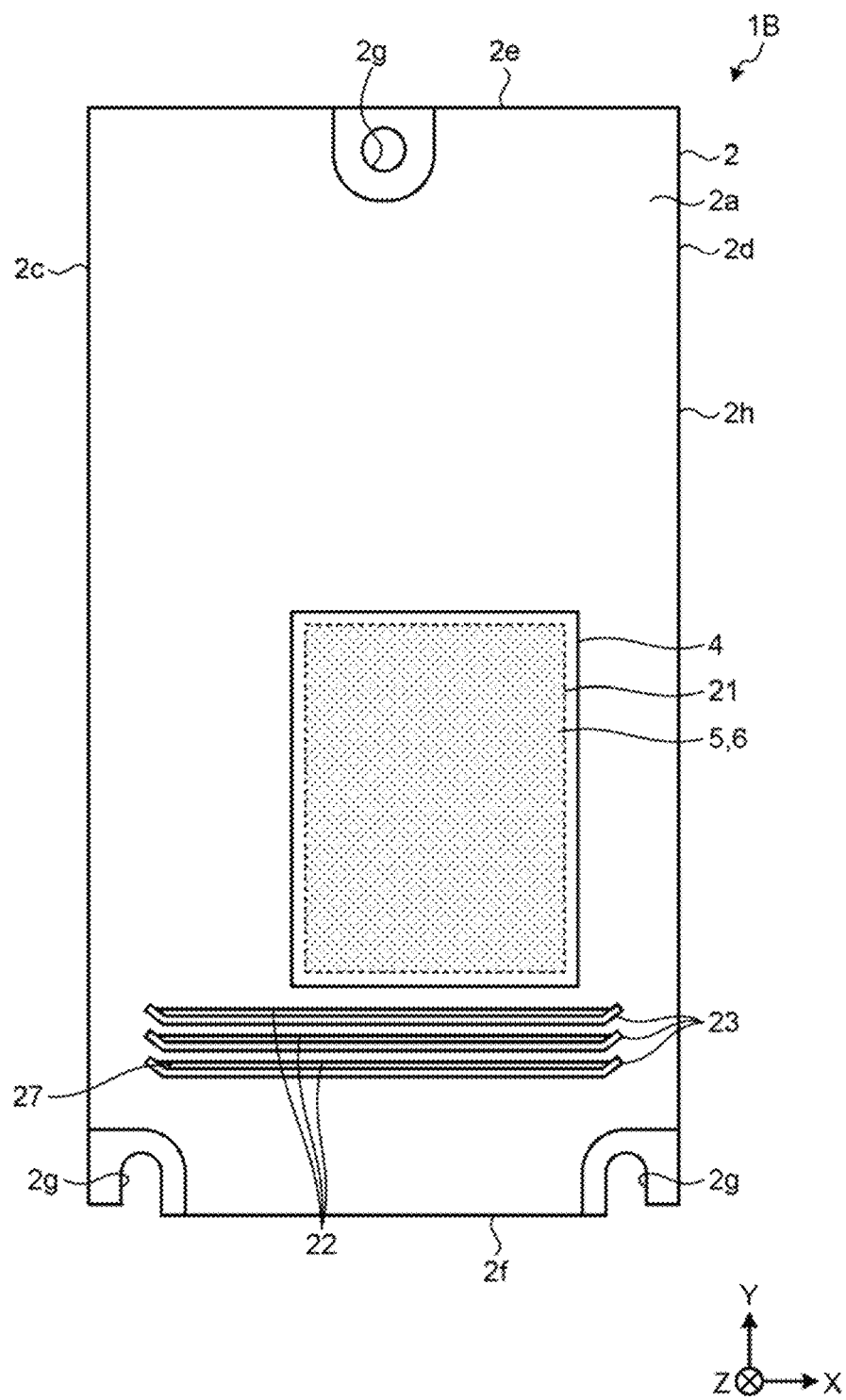
FIG. 11 is a front view of a heat sink according to a third embodiment of the present invention.
Figure 12:
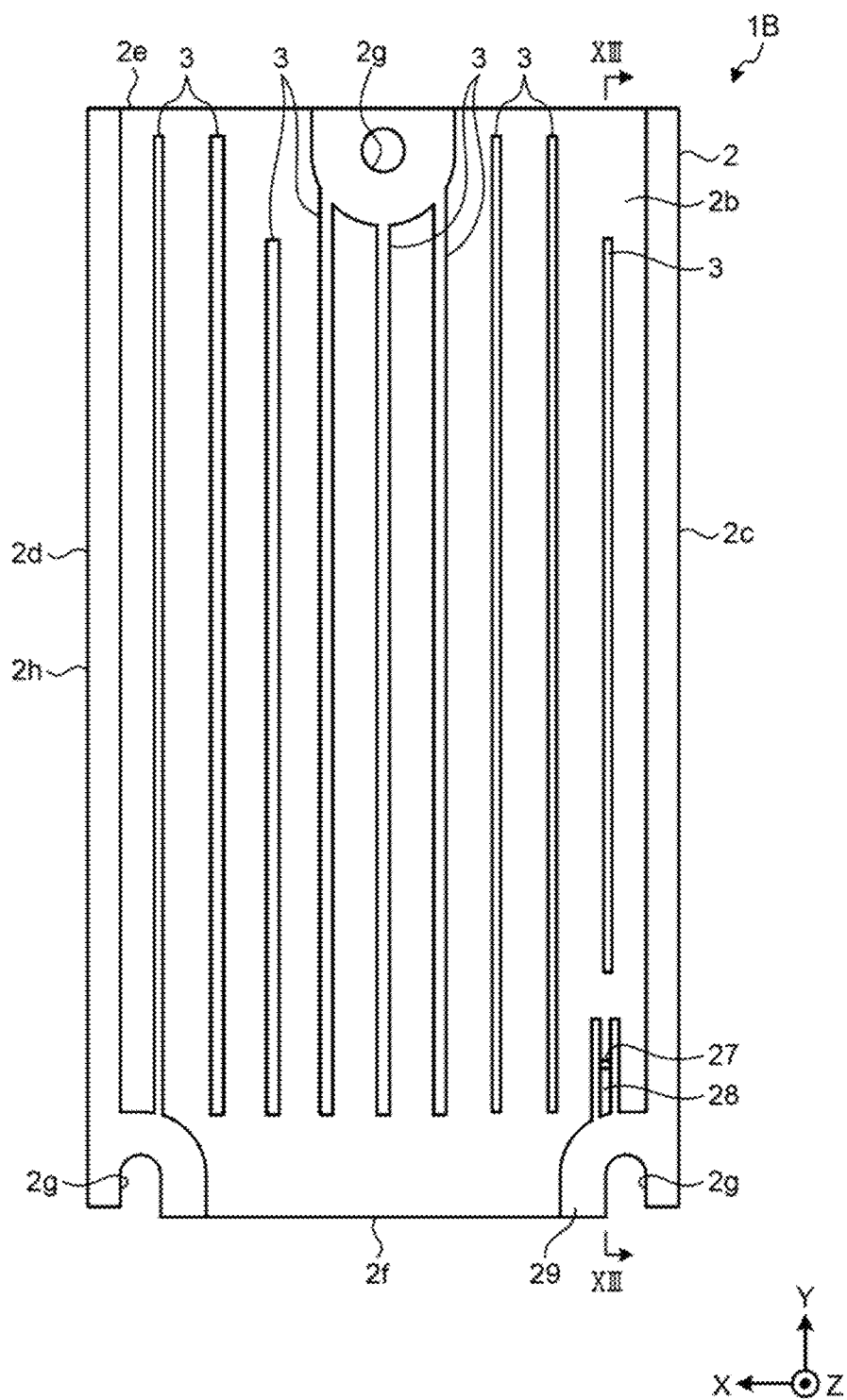
FIG. 12 is a back view of the heat sink according to the third embodiment of the present invention.
Figure 13:
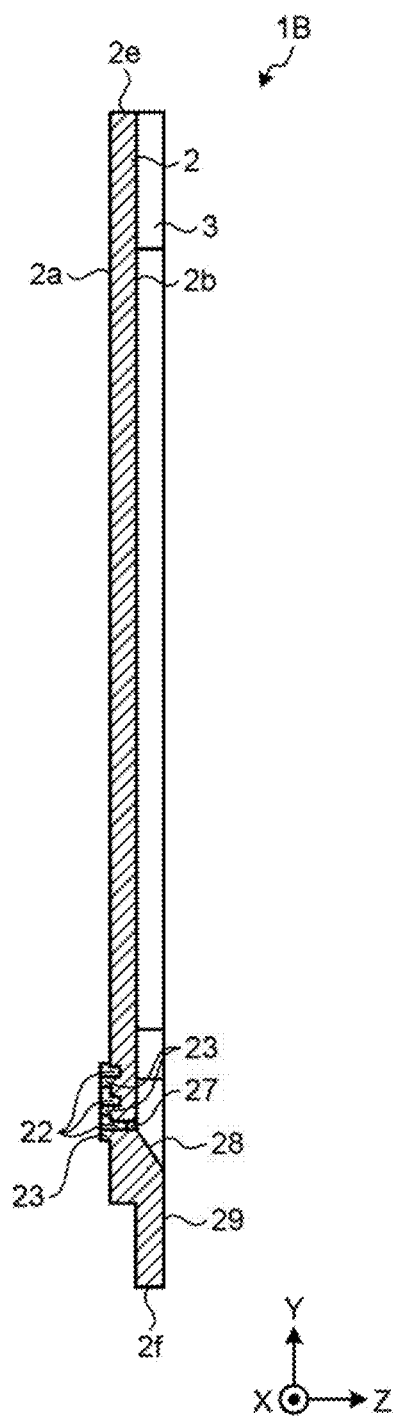
FIG. 13 is a cross-sectional view of the heat sink taken along line XIII-XIII in FIG. 12.
Figure 14:
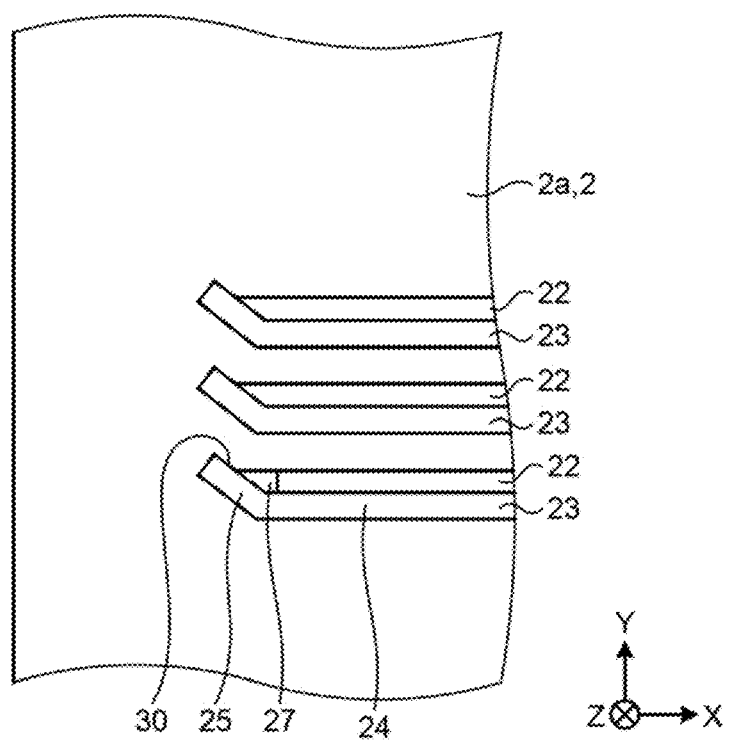
FIG. 14 is an enlarged view of the first grooves and the walls illustrated in FIG. 11.
Figure 15:
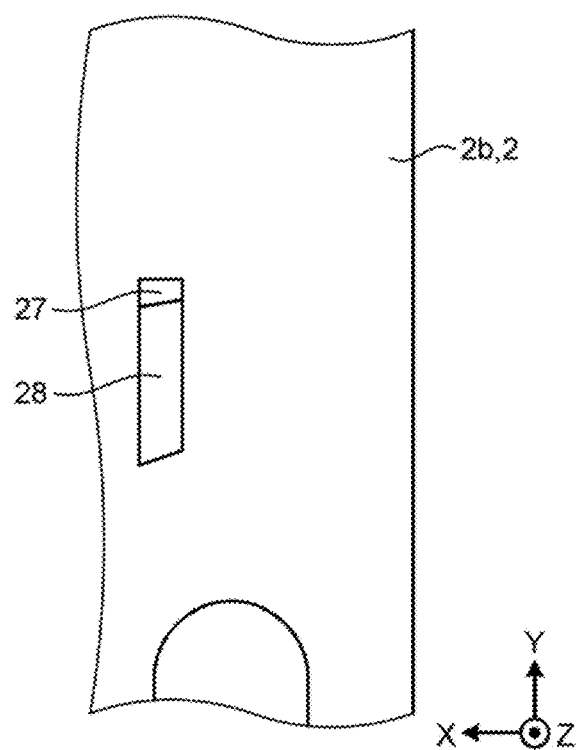
FIG. 15 is an enlarged view of a through hole and a guide surface illustrated in FIG. 12.
Figure 16:
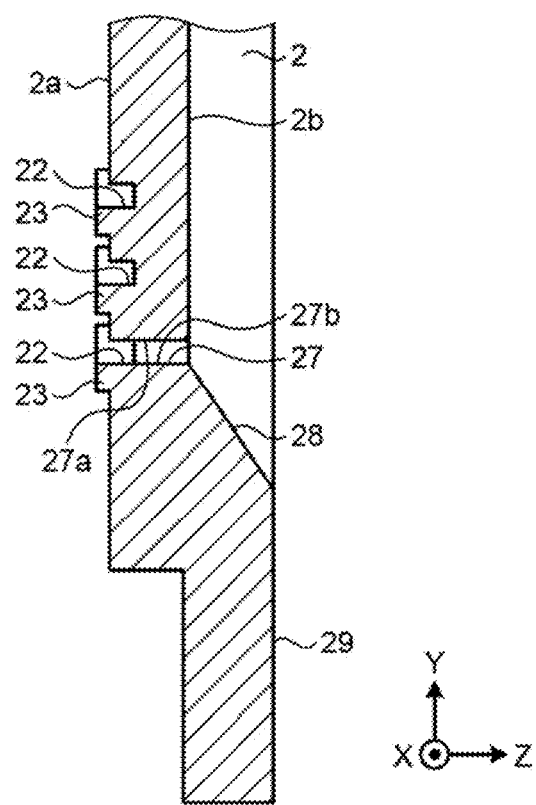
FIG. 16 is an enlarged cross-sectional view of the first grooves, the walls, the through hole, and the guide surface illustrated in FIG. 13.

FIG. 11 is a front view of a heat sink 1B according to a third embodiment of the present invention. FIG. 12 is a back view of the heat sink 1B according to the third embodiment of the present invention. FIG. 13 is a cross-sectional view of the heat sink 1B taken along line XIII-XIII in FIG. 12. FIG. 14 is an enlarged view of the first grooves 22 and the walls 23 illustrated in FIG. 11. FIG. 15 is an enlarged view of a through hole 27 and a guide surface 28 illustrated in FIG. 12. FIG. 16 is an enlarged cross-sectional view of the first grooves 22, the walls 23, the through hole 27, and the guide surface 28 illustrated in FIG. 13. The present embodiment is different from the first embodiment in that the heat sink 1B further includes the through hole 27 and the guide surface 28. In the third embodiment, the parts that are the same as those in the first embodiment described above are designated by the same reference characters and descriptions thereof will be omitted.

As illustrated in FIGS. 11 to 16, the through hole 27 extending from the first surface 2a to the second surface 2b is formed in the base plate 2 of the heat sink 1B. As illustrated in FIG. 11, the through hole 27 is open below the attachment area 21 in the first surface 2a. In the present embodiment, the through hole 27 communicates with the lowermost first groove 22. As illustrated in FIG. 16, the through hole 27 serves to direct the oil 6 (not illustrated) flown into the first groove 22 to the second surface 2b. The inner wall of the through hole 27 includes a hole top surface 27a and a hole bottom surface 27b spaced below the hole top surface 27a. The hole top surface 27a extends linearly in the direction in which the through hole 27 extends. The hole bottom surface 27b extends linearly in the direction in which the through hole 27 extends. The guide surface 28 is continuous with the tip of the hole bottom surface 27b. The guide surface 28 is inclined downward as it extends away from the hole bottom surface 27b. An apparatus attachment area 29 to be in contact with the power conversion apparatus (not illustrated) is formed around the attachment hole 2g. The lower end of the guide surface 28 is connected to the apparatus attachment area 29.

In the present embodiment, the heat sink 1B is formed with the through hole 27 extending from the first surface 2a to the second surface 2b and the through hole 27 communicates with the lowermost first groove 22. Accordingly, when the oil 6 reaches the lowermost first groove 22, the oil 6 flows through the through hole 27 from the first groove 22 and reaches the guide surface 28. The oil 6 that has flown along the guide surface 28 and the apparatus attachment area 29 flows from the apparatus attachment area 29 to the wall surface of the power conversion apparatus and then drops from the wall surface of the power conversion apparatus to the floor at the installation site of the power conversion apparatus. Although not illustrated, the lower end of the wall surface of the power conversion apparatus is located lower than the lower end of the apparatus attachment area 29. If the oil 6 directly drops from the heat sink 1B to the floor at the installation site of the power conversion apparatus, there arises a problem in that the oil 6 that has impinged on the floor rebounds off the floor and splashes. Moreover, if the oil 6 flows along the electric wires connected to the power conversion apparatus, there arises a problem in that components connected to the electric wires are also contaminated with the oil 6. In this respect, in the present embodiment, the oil 6 flows from the apparatus attachment area 29 to the wall surface of the power conversion apparatus and drops from the wall surface of the power conversion apparatus to the floor at the installation site of the power conversion apparatus; therefore, an occurrence of the two problems described above can be prevented.

The configurations described in the above embodiments show examples of the content of the present invention. The configurations can be combined with other well-known techniques, and can be partly omitted or modified without departing from the scope of the present invention.

REFERENCE SIGNS LIST 1, 1A, 1B heat sink; 2 base plate; 2a first surface; 2b second surface; 2c third surface; 2d fourth surface; 2e top surface; 2f bottom surface; 2g attachment hole; 2h first side; 3 fin; 4 semiconductor module; 5 thermal grease; 6 oil; 21 attachment area; 22, 22a, 22b, 22c first groove; 22d groove top surface; 22e groove bottom surface; 22f groove side surface; 229 gap; 23, 23a, 23b, 23c wall; 24 first wall; 25 second wall; 26 second groove; 27 through hole; 27a hole top surface; 27b hole bottom surface; 28 guide surface; 29 apparatus attachment area; 30 corner portion.

The invention claimed is:

1. A heat sink that includes a first surface including an attachment area to which a heating element is attached and that is installed such that a first side of the first surface extends in a vertical direction, wherein
a thermal grease containing oil is applied to the attachment area,
a plurality of first grooves extending in a horizontal direction are formed below the attachment area in the first surface,
the first grooves are provided spaced apart from each other in the vertical direction,
an inner wall of each of the first grooves includes a groove top surface and a groove bottom surface spaced below the groove top surface,
a length of each of the first grooves in the horizontal direction is shorter than a length of the first surface in the horizontal direction,
a plurality of walls are formed on the first surface and project from the first surface,
the walls are provided spaced apart from each other in the vertical direction,
each of the walls includes a first wall extending in the horizontal direction and second walls that are respectively connected to both end portions of the first wall in the horizontal direction and are inclined upward as the second walls extend away from the first wall in the horizontal direction, and
when the heat sink is installed such that the first side of the first surface extends in the vertical direction, the first grooves and the walls are disposed such that the first wall is located in a lower portion of an opening edge of a corresponding one of the first grooves and the second walls are located in lateral portions of an opening edge of a corresponding one of the first grooves.

2. The heat sink according to claim 1, wherein
when a first height represents a height of the oil retained on the groove top surface in a form of a droplet due to a surface tension, immediately before dropping to the groove bottom surface, and a second height represents a maximum rise height of the oil retained on the groove bottom surface and formed into a droplet while maintaining a surface tension, a height of the first grooves in the vertical direction is set lower than or equal to a third height that is the first height plus the second height.

3. The heat sink according to claim 1, wherein
a height of the first grooves in the vertical direction is a height calculated based on a material of the groove bottom surface, a surface condition of the groove bottom surface, a radius of a droplet of the oil retained on the groove bottom surface, and a contact angle of a droplet of the oil retained on the groove bottom surface.

4. The heat sink according to claim 1, wherein
a height of the first grooves in the vertical direction is a height calculated based on a material of the groove bottom surface, a surface condition of the groove bottom surface, a radius of a droplet of the oil retained on the groove bottom surface, and a contact angle of a droplet of the oil retained on the groove bottom surface,
a maximum rise height H4 of the oil retained on the groove bottom surface and formed into a droplet while maintaining a surface tension is a height calculated by the following formula (1), and
a height H1 of the first grooves in the vertical direction is a height calculated by the following formula (2):

$$H4 = r \cdot \tan(\theta/2) \qquad (1)$$

$$H1 = 2 \cdot H4 \qquad (2)$$

where r represents a radius of a droplet of the oil retained on the groove bottom surface, and
θ represents a contact angle of a droplet of the oil retained on the groove bottom surface.

5. The heat sink according to claim 1, wherein
a second groove narrower than the first grooves is formed on the first surface at a position different from the attachment area.

6. The heat sink according to claim 1, further comprising a second surface opposite the first surface, wherein
a through hole extending from the first surface to the second surface is formed in the heat sink, and
the through hole is open below the attachment area in the first surface.

* * * * *